(12) United States Patent
Kawai et al.

(10) Patent No.: US 8,922,279 B2
(45) Date of Patent: Dec. 30, 2014

(54) VOLTAGE CONTROLLED VARIABLE GAIN AMPLIFIER CIRCUIT

(75) Inventors: Taichiro Kawai, Kiryu (JP); Takashi Tokano, Kumagaya (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 46 days.

(21) Appl. No.: 13/596,882

(22) Filed: Aug. 28, 2012

(65) Prior Publication Data

US 2013/0049865 A1 Feb. 28, 2013

(30) Foreign Application Priority Data

Aug. 29, 2011 (JP) .................................. 2011-185729

(51) Int. Cl.
*H03F 3/45* (2006.01)
*H03G 1/00* (2006.01)
(52) U.S. Cl.
CPC .............. *H03G 1/0035* (2013.01); *H03F 3/45* (2013.01); *H03G 1/0023* (2013.01); *H03G 1/0029* (2013.01)
USPC .......................................... 330/254; 330/295

(58) Field of Classification Search
CPC ...... H03F 3/45183; H03F 3/45; H03G 1/0035
USPC .................................................. 330/254, 295
See application file for complete search history.

(56) References Cited

U.S. PATENT DOCUMENTS 7,973,602 B2 * 7/2011 Shivaram et al. ............. 330/254
8,102,209 B2 * 1/2012 Jang et al. ..................... 330/254

FOREIGN PATENT DOCUMENTS

JP 5-218767 8/1993

* cited by examiner

*Primary Examiner* — Robert Pascal
*Assistant Examiner* — Khiem Nguyen

(57) ABSTRACT

This invention provides a voltage controlled variable gain amplifier circuit that varies its gain linearly and continuously against a gain control voltage VC. The voltage controlled variable gain amplifier circuit includes a first differential amplifier, a second differential amplifier, a gain control voltage/current conversion circuit and a reference current generation circuit. The first differential amplifier and the second differential amplifier are connected in series. The gain control voltage/current conversion circuit converts the gain control voltage VC into a gain control current IC that varies linearly against the gain control voltage VC. Drain currents Id1 and Id2 of first and second differential input transistors vary linearly against the gain control current IC.

20 Claims, 10 Drawing Sheets

VOLTAGE CONTROLLED VARIABLE GAIN AMPLIFIER CIRCUIT

CROSS-REFERENCE OF THE INVENTION

This application claims priority from Japanese Patent Application No. 2011-185729, the content of which is incorporated herein by reference in its entirety.

BACKGROUND OF THE INVENTION

1. Field of the Invention

This invention relates to a voltage controlled variable gain amplifier circuit that varies its gain linearly against a gain control voltage.

2. Description of the Related Art

There have been known a programmable gain amplifier circuit that discretely varies its gain against the gain control voltage and a voltage controlled variable gain amplifier circuit that linearly varies a logarithm of its gain against the gain control voltage. Depending on application fields of the voltage controlled variable gain amplifier circuit, however, developing a voltage controlled variable gain amplifier circuit that varies its gain linearly and continuously against the gain control voltage is required in order to improve controllability of the gain. Related technologies are disclosed in Japanese Patent Application Publication No. H05-218767, for example.

This invention is directed to providing a voltage controlled variable gain amplifier circuit that varies its gain linearly and continuously against the gain control voltage. Also, this invention is directed to suppressing dependence of the gain of the voltage controlled variable gain amplifier circuit on a power supply voltage.

Furthermore, this invention is directed to suppressing variations due to semiconductor manufacturing processes and temperature dependence of the gain of the voltage controlled variable gain amplifier circuit.

SUMMARY OF THE INVENTION

This invention provides a voltage controlled variable gain amplifier circuit provided with a first differential amplifier having a constant current source generating a reference current, a pair of differential input transistors to which the reference current from the constant current source is supplied, a pair of output terminals outputting a pair of differential output voltages and first and second output resistors connected in series between the pair of output terminals, a second differential amplifier having the same structure as the first differential amplifier and receiving the pair of differential output voltages from the first differential amplifier, a gain control voltage/current conversion circuit converting a gain control voltage into a gain control current that varies linearly against the gain control voltage, and a current bypass circuit forming bypass routes through each of which a portion of the reference current corresponding to the gain control current bypasses each of the differential input transistors, respectively.

DETAILED DESCRIPTION OF THE INVENTION

Figure 1:
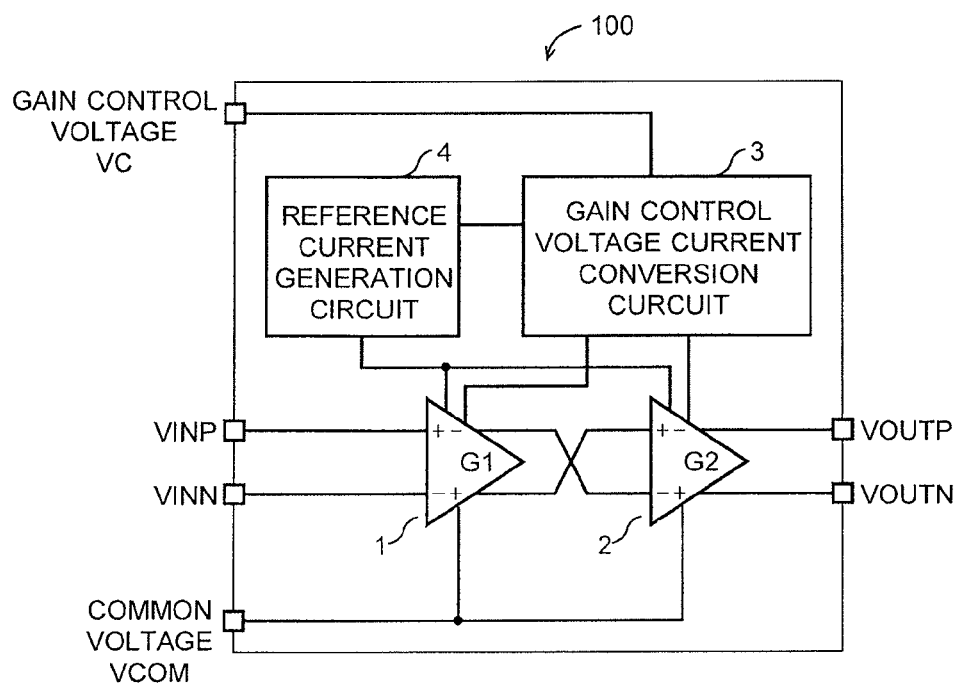
FIG. 1 is a block diagram showing a voltage controlled variable gain amplifier circuit according to an embodiment of this invention.
Figure 2:
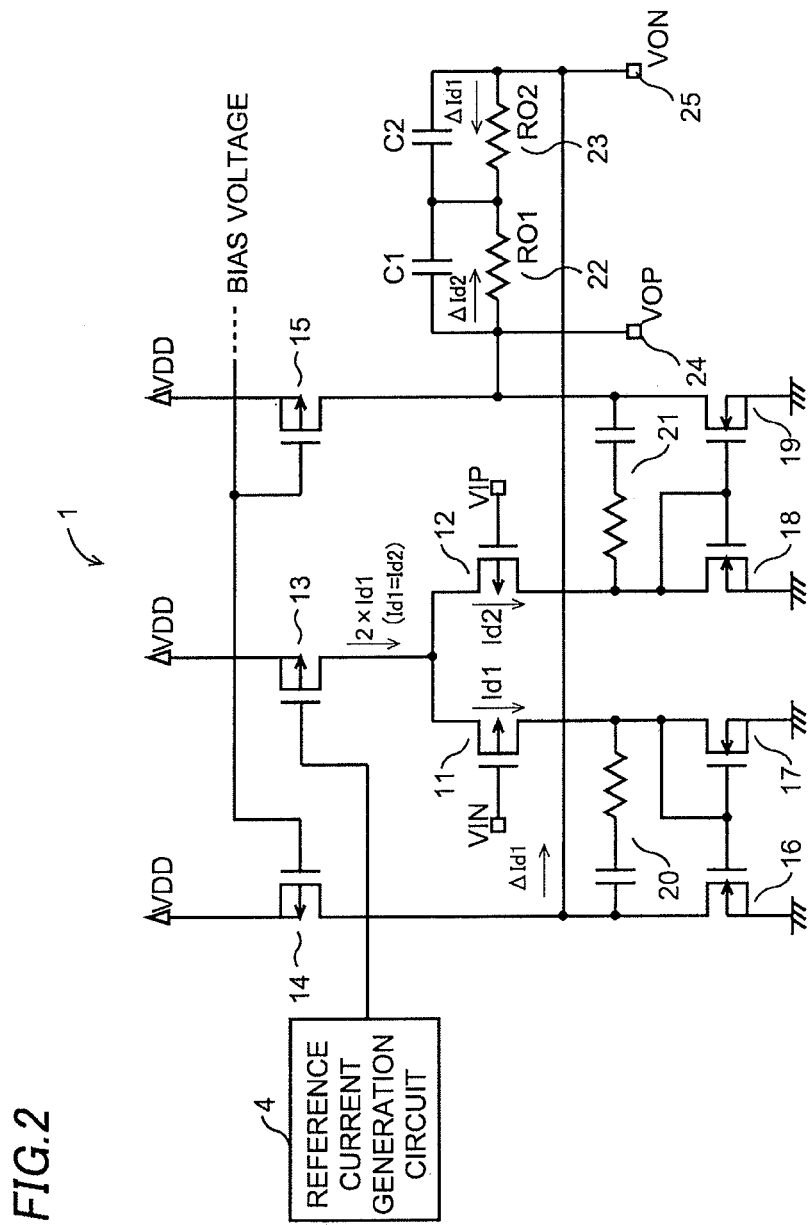
FIG. 2 is a circuit diagram of a first differential amplifier constituting the voltage controlled variable gain amplifier circuit according to the embodiment of this invention.

FIG. 1 is a block diagram showing a voltage controlled variable gain amplifier circuit 100 according to an embodiment of this invention. The voltage controlled variable gain amplifier circuit 100 includes a first differential amplifier 1, a second differential amplifier 2, a gain control voltage/current conversion circuit 3 and a reference current generation circuit 4. FIG. 2 is a circuit diagram of the first differential circuit 1. The second differential amplifier 2 has the same circuit structure as the first differential amplifier 1, and receives differential outputs from the first differential amplifier 1 to operate. The voltage controlled variable gain amplifier circuit 100 can be manufactured as a semiconductor integrated circuit chip.

The voltage controlled variable gain amplifier circuit 100 is structured so that its gain varies linearly and continuously against a gain control voltage. First, basic principles of the voltage controlled variable gain amplifier circuit 100 are explained referring to FIG. 1 and FIG. 2.

A gain G1 of the first differential amplifier 1 in a first stage is determined by a transconductance gm1 of a differential input transistor 11, a transconductance gm2 of a differential input transistor 12, a resistance RO1 of a first output resistor 22 and a resistance RO2 of a second output resistor 23, and is represented by an equation G1=gm×RO when gm1=gm2=gm and RO1=RO2=RO. Also, a gain G2 of the second differential amplifier 2 in a second stage is represented by an equation G2=gm×RO.

Figure 6:
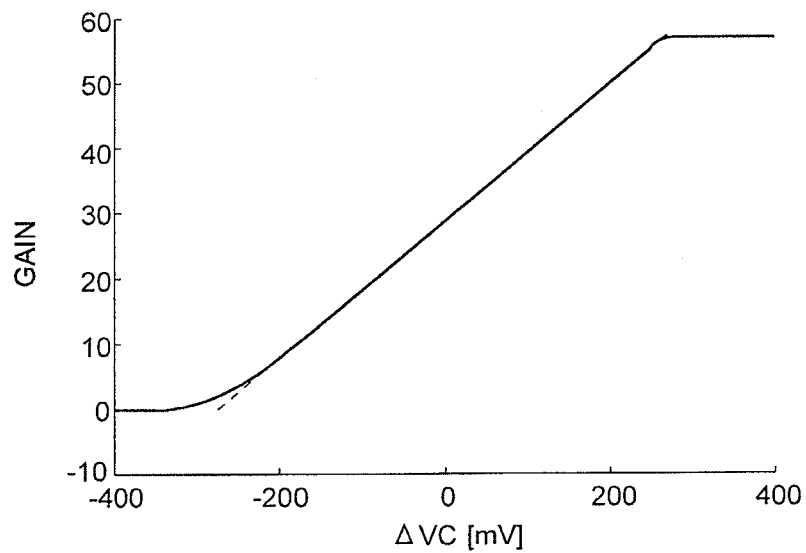
FIG. 6 shows a correlation between a gain of the voltage controlled variable gain amplifier and the gain control voltage.

Since the first differential amplifier 1 and the second differential amplifier 2 are connected in series in the voltage controlled variable gain amplifier circuit 100, a total gain G obtained from the second differential amplifier 2 in the second stage is represented by an equation G=G1×G2= (gm·RO)². Since gm∝√Id1 as will be described later, the total gain G is proportional to Id1 (G∝Id1), where Id1 denotes a drain current of the first differential input transistor 11 in the first differential amplifier 1. A drain current Id2 of the second differential input transistor 12 is equal to Id1 (Id1=Id2). The gain control voltage/current conversion circuit 3 basically converts a gain control voltage VC into a gain control current IC that varies linearly against the gain control voltage VC. Therefore, the gain G varies linearly against the gain control voltage VC as shown in FIG. 6, when the drain currents Id1 and Id2 of the first and second differential transistor 11 and 12 are configured so as to vary linearly against the gain control current IC.

The structure of the first differential amplifier 1 will be explained referring to FIG. 2. The second differential amplifier 2 has the same structure as the first differential amplifier 1, as described above.

The first differential amplifier 1 includes the first differential input transistor 11 made of a P-channel type MOS transistor, the second differential input transistor 12 made of a P-channel type MOS transistor, constant current source transistors 13, 14 and 15 made of P-channel type MOS transistors, a first current mirror circuit made of N-channel type MOS transistors 16 and 17, a second current mirror circuit made of N-channel type MOS transistors 18 and 19, a first phase compensation circuit 20 and a second phase compensation circuit 21 each made of a capacitor for phase compensation and a resistor for zero cancellation, a first output resistor 22, a second output resistor 23, a first capacitor C1 and a second capacitor C2.

Although the actual first differential amplifier 1 is provided with a current bypass circuit 50 that will be described later referring to FIG. 4, the structure of the first differential amplifier 1 excluding the current bypass circuit 50 is explained here.

A power supply voltage VDD is applied to a source of each of the constant current source transistors 13, 14 and 15. A drain of the constant current source transistor 13 is connected with a common source of the first and second differential input transistors 11 and 12. A bias voltage from the reference current generation circuit 4 is applied to a gate of the constant current source transistor 13 so that a constant drain current 2×Id1 flows as a reference current. While each of the drain currents Id1 and Id2 flows through each of the first and second differential input transistors 11 and 12, respectively, the first and second differential input transistors 11 and 12 are assumed to have a size and electric characteristics identical to each other so that Id1 is equal to Id2.

The first current mirror circuit is connected to a drain of the first differential input transistor 11, and the second current mirror circuit is connected to a drain of the second differential input transistor 12.

A common bias voltage is applied to a gate of each of the constant current source transistors 14 and 15. Each of differential input voltages VIN and VIP is applied to a gate of each of the first and second differential input transistors 11 and 12, respectively. A differential output voltage VOP is outputted from a first output terminal 24 connected to a connecting node between the constant current source transistor 15 and the N-channel type MOS transistor 19, while another differential output voltage VON is outputted from a second output terminal 25 connected to a connecting node between the constant current source transistor 14l and the N-channel type MOS transistor 16.

The first output resistor 22 and the second output resistor 23 are connected in series between the first output terminal 24 and the second output terminal 25. The resistance RO1 of the first output resistor 22 and the resistance RO2 of the second output resistor 23 are set to a common resistance RO (RO1=RO2=RO).

The first capacitor C1 is connected in parallel with the first output resistor 22, while the second capacitor C2 is connected in parallel with the second output resistor 23. A connecting node between the first output resistor 22 and the second output resistor 23 is adjusted to a constant common voltage VCOM (central voltage).

The gain G1 of the first differential amplifier 1 and the total gain G of the voltage controlled variable gain amplifier circuit 100 will be determined hereafter. When VIN varies by ΔVIN, the drain current Id1 of the first differential input transistor 11 varies by ΔId1 accordingly. Then, ΔId1 is represented by Equation 1:

$$\Delta Id1 = gm1 \cdot \Delta VIN = gm \cdot \Delta VIN \quad \text{[Equation 1]}$$

where gm1 denotes the transconductance of the first differential input transistor 11, and is assumed to be equal to the transconductance gm2 of the second differential input transistor 12 (gm1=gm2=gm). Since a constant current from the constant current source transistor 14 flows through the N-channel type MOS transistor 16, the variation ΔId1 in the drain current Id1 ends up in flowing into the second output resistor 23. As a result, the differential output voltage VON varies by ΔVON. Therefore, ΔVON is represented by Equation 2:

$$\Delta VON = \Delta Id1 \cdot RO = gm \cdot RO \cdot \Delta VIN \quad \text{[Equation 2]}$$

Similarly, when VIP varies by ΔVIP, the drain current Id2 of the second differential input transistor 12 varies by ΔId2 accordingly. Then, ΔId2 is represented by Equation 3:

$$\Delta Id2 = gm2 \cdot \Delta VIP = gm \cdot \Delta VIP \quad \text{[Equation 3]}$$

A variation ΔVOP in the differential output voltage VOP caused by ΔId2 is represented by Equation 4:

$$\Delta VOP = \Delta Id2 \cdot RO1 = gm \cdot RO \cdot \Delta VIP \quad \text{[Equation 4]}$$

Therefore, the gain G1 is represented by Equation 5:

$$G1 = \frac{\Delta VOP - \Delta VON}{\Delta VIP - \Delta VIN} = gm \cdot RO \quad \text{[Equation 5]}$$

From a drain current equation of the first differential input transistor 11 in a saturation region, Id1 is represented by Equation 6:

$$Id1 = \frac{1}{2} \cdot \mu p \cdot Cox \cdot S1 \cdot (Vgs1 - Vtp1)^2 \quad \text{[Equation 6]}$$

where μp denotes a mobility, Cox denotes a gate capacitance per unit area, S1 denotes a gate size ratio, Vgs1 denotes a gate-source voltage and Vtp1 denotes a threshold voltage. The gate size ratio means W/L that is a ratio of a channel width W to a channel length L of the first differential input transistor 11. The same applies in the rest of the description.

The transconductance gm is represented by Equation 7:

$$gm = \frac{\partial Id1}{\partial Vgs1} = \mu p \cdot Cox \cdot S1 \cdot (Vgs1 - Vtp1) \qquad \text{[Equation 7]}$$

Therefore, the gain G1 is represented by Equation 8:

$$G1 = \sqrt{2\mu p \cdot Cox \cdot S1 \cdot Id1} \cdot RO \qquad \text{[Equation 8]}$$

That means the gain G1 is proportional to $\sqrt{Id1}$.

Thus, the total gain G of the voltage controlled variable gain amplifier circuit 100 is represented by Equation 9:

$$G = G1 \times G2 = 4\beta 1 \cdot RO^2 \cdot Id1 \qquad \text{[Equation 9]}$$

where β1 is given by Equation 10:

$$\beta 1 = \frac{1}{2} \cdot \mu p \cdot Cox \cdot S1 \qquad \text{[Equation 10]}$$

The gain control voltage/current conversion circuit 3 converts the gain control voltage VC into the gain control current IC that varies linearly against the gain control voltage VC, as described above. The current bypass circuit 50 is structured so that the drain currents Id1 and Id2 of the first and second differential input transistors 11 and 12 vary linearly against the gain control current IC.

Concrete structures of the gain control voltage/current conversion circuit 3 and the current bypass circuit 50 will be explained below.

The gain control voltage/current conversion circuit 3 basically performs voltage/current conversion using a resistor 34, and converts the gain control voltage VC into a first gain control current IC1 and a second gain control current IC2 that vary linearly against the gain control voltage VC. Each of IC1 and IC2 is supplied to each of the first and second differential amplifiers 1 and 2 through a current mirror circuit, respectively.

Figure 3A:
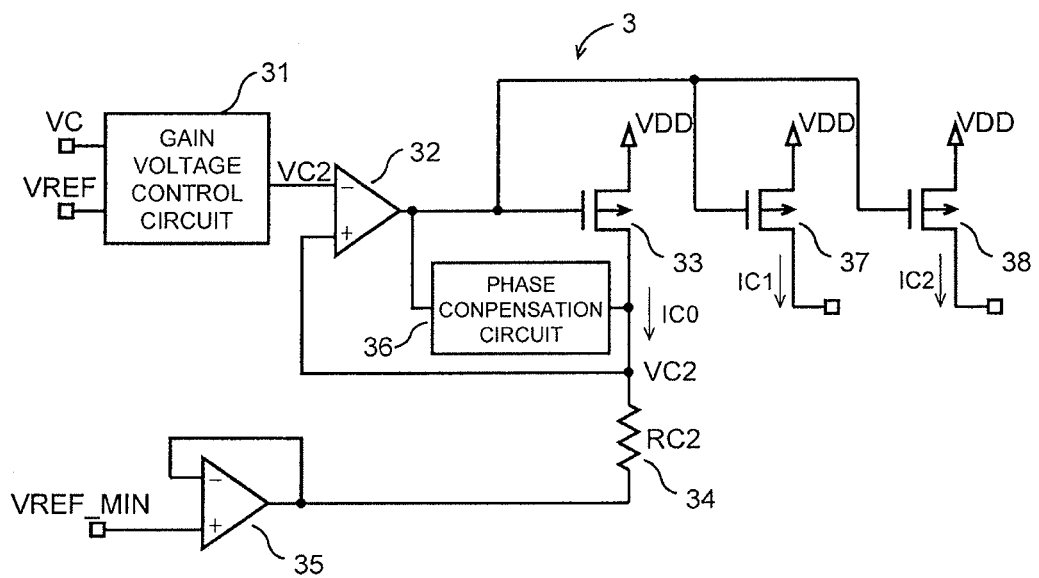
FIGS. 3A and 3B are circuit diagrams showing a first example circuit of a gain control voltage/current conversion circuit constituting the voltage controlled variable gain amplifier circuit according to the embodiment of this invention.

FIG. 3A is a circuit diagram of the gain control voltage/current conversion circuit 3. The gain control voltage/current conversion circuit 3 includes a gain voltage control circuit 31, an operational amplifier 32, a control transistor 33 made of a P-channel type MOS transistor, the resistor 34 for voltage/current conversion, a buffer amplifier 35, a phase compensation circuit 36 for preventing oscillation, and first and second mirror transistors 37 and 38 made of P-channel type MOS transistors, and is structured as shown in FIG. 3A.

Figure 3B:
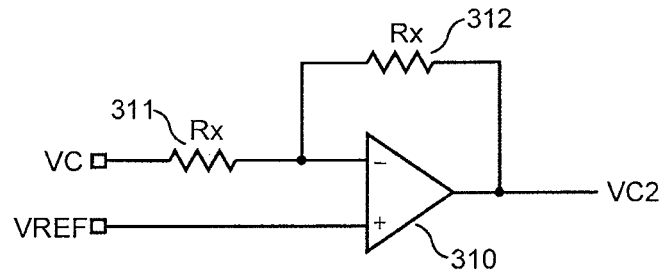

The gain voltage control circuit 31 generates an inverted gain control voltage VC2 by inverting the gain control voltage VC with respect to a reference voltage VREF of a DC level. The gain voltage control circuit 31 is composed of an operational amplifier 310 having an inverting input terminal (−) to which the gain control voltage VC is applied through an input resistor 311 and a non-inverting input terminal (+) to which the reference voltage VREF is applied and a feedback resistor 312 connected between the inverting input terminal (−) and an output terminal of the operational amplifier 310 as shown in FIG. 3B, for example. Each of resistances of the input resistor 311 and the feedback resistor 312 is Rx.

The inverted gain control voltage VC2 outputted from the gain voltage control circuit 31 is applied to an inverting input terminal (−) of the operational amplifier 32. An output voltage of the operational amplifier 32 is applied to a gate of the control transistor 33 while the power supply voltage VDD is applied to its source.

A drain of the control transistor 33 is connected to one end of the resistor 34 that has a resistance RC2. A connecting node between the control transistor 33 and the resistor 34 is connected to a non-inverting input terminal (+) of the operational amplifier 32. A minimum reference voltage VREF_MIN is applied to another end of the resistor 34 through the buffer amplifier 35. The operational amplifier 32 makes a control current IC0 flow through the control transistor 33 so that a voltage at the one end of the resistor 34 becomes VC2. Operations of the gain control voltage/current conversion circuit 3 are explained hereinafter. ΔVC and ΔVC2 are defined by Equations 11 and 12, respectively.

$$\Delta VC = VC - VREF \qquad \text{[Equation 11]}$$

$$\Delta VC2 = VC2 - VREF \qquad \text{[Equation 12]}$$

ΔVC is a gain control voltage taking the reference voltage VREF as a reference, while ΔVC2 is an inverted gain control voltage taking the reference voltage VREF as the reference.

Since the inverted gain control voltage VC2 is generated by inverting the gain control voltage VC with respect to the reference voltage VREF, ΔVC2 is an inversion of ΔVC as represented by Equation 13:

$$\Delta VC2 = -\Delta VC \qquad \text{[Equation 13]}$$

ΔVC0 is defined by Equation 14:

$$\Delta VC0 = VREF - VREF\_MIN \qquad \text{[Equation 14]}$$

The gain control voltage ΔVC varies in a range between −ΔVC0 and ΔVC0. The control current IC0 flows through the control transistor 33, while each of the first and second gain control currents IC1 and IC2 flows through each of the first and second mirror transistors 37 and 38, respectively. It is preferable that IC0, IC1 and IC2 are set to the same value (IC0=IC1=IC2) by setting sizes of the transistors 33, 37 and 38 equal to each other. The control current IC0 is represented by Equation 15:

$$IC0 = \frac{VC2 - VREF\_MIN}{RC2} \qquad \text{[Equation 15]}$$

Equation 16 is derived by modifying Equation 15 using Equations 12, 13 and 14:

$$IC0 = \frac{\Delta VC2 - \Delta VC0}{RC2} = \frac{-\Delta VC + \Delta VC0}{RC2} = \frac{\Delta VC}{RC2} + \frac{\Delta VC0}{RC2} \qquad \text{[Equation 16]}$$

Figure 5:
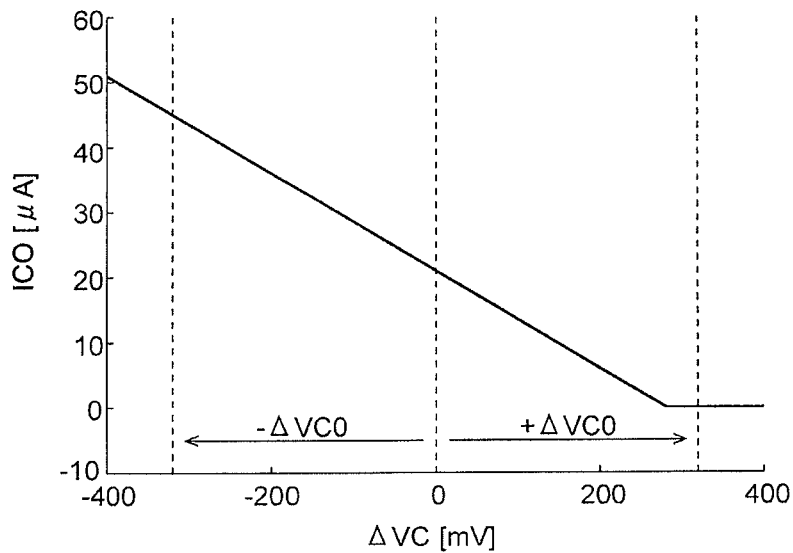
FIG. 5 shows a correlation between a gain control current and a gain control voltage.

In Equation 16, −1/RC2·ΔVC varies linearly against ΔVC, while ΔVC0/RC2 is fixed against ΔVC. That is, IC0 varies linearly against ΔVC. FIG. 5 shows a correlation between IC0 and ΔVC.

In this case, ΔVC0/RC2 is set as represented by Equation 17:

$$\frac{\Delta VC0}{RC2} = 0.5 \times Id2 \qquad \text{[Equation 17]}$$

The drain current Id1 of the first differential input transistor 11 is equal to the drain current Id2 of the second differential input transistor 12 (Id1=Id2), as described above. Therefore, the gain control current IC1 is represented by Equation 18:

$$IC1 = -\frac{\Delta VC}{RC2} + 0.5 \times Id1 \quad \text{[Equation 18]}$$

Figure 4A:
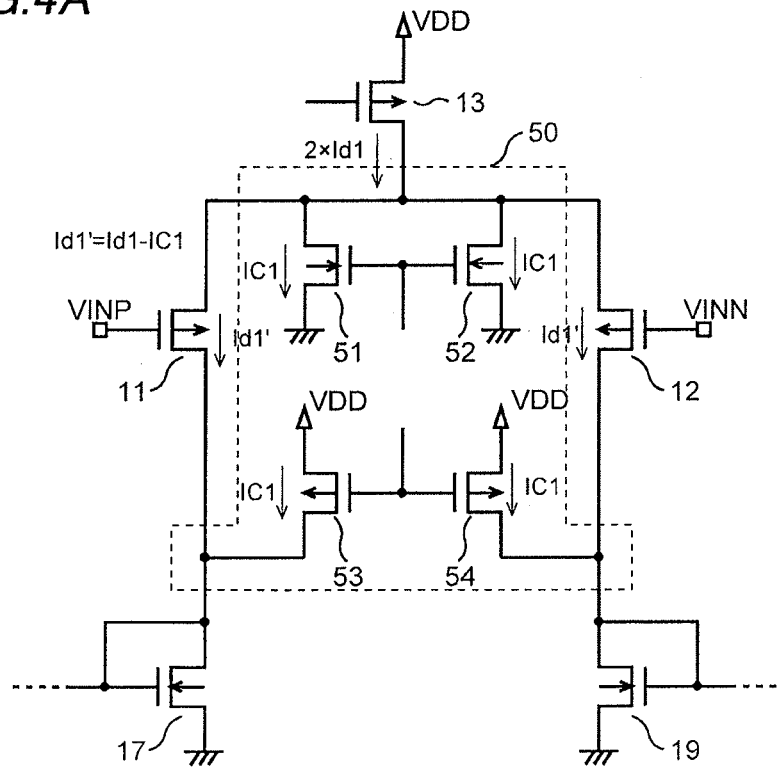
FIGS. 4A and 4B are circuit diagrams showing a current bypass circuit constituting the voltage controlled variable gain amplifier circuit according to the embodiment of this invention.
Figure 4B:
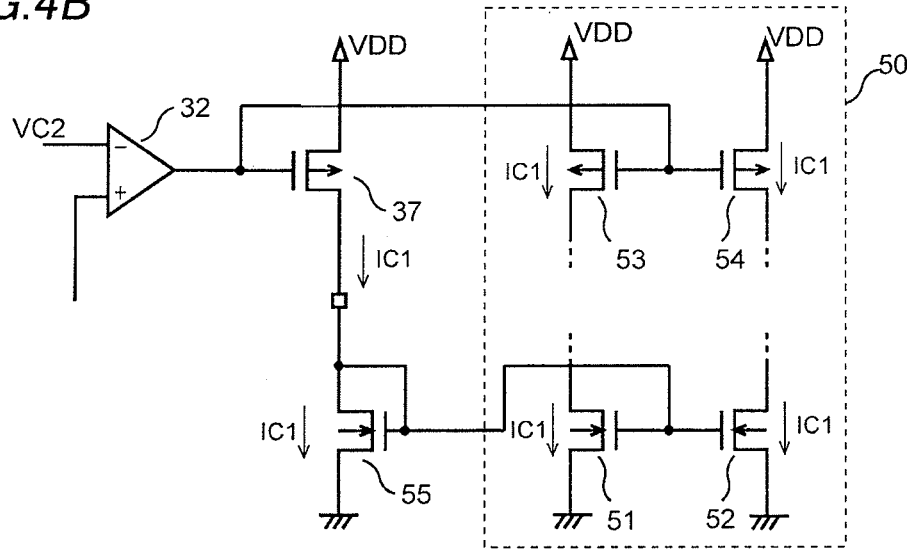

The current bypass circuit 50 is structured so that the drain currents Id1 and Id2 (Id1=Id2) of the first and second differential input transistors 11 and 12 in each of the first and second differential amplifiers 1 and 2 vary linearly against the gain control current IC1. FIG. 4A is a circuit diagram of the current bypass circuit 50. FIG. 4B is a circuit diagram showing connections between the current bypass circuit 50 and the gain control voltage/current conversion circuit 3.

The current bypass circuit 50 includes a pair of first bypass transistors 51 and 52 made of N-channel type MOS transistors and a pair of second bypass transistors 53 and 54 made of P-channel MOS transistors. A drain of the first bypass transistor 51 is connected to a connecting node between the first differential input transistor 11 and the constant current source transistor 13, and its source is grounded. A drain of the other first bypass transistor 52 is connected to a connecting node between the second differential input transistor 12 and the constant current source transistor 13, and its source is grounded.

A drain of the second bypass transistor 53 is connected to a connecting node between the first differential input transistor 11 and a drain of the N-channel type MOS transistor 17 constituting the first current mirror circuit. The power supply voltage VDD is applied to a source of the second bypass transistor 53. A drain of the other second bypass transistor 54 is connected to a connecting node between the second differential input transistor 12 and a drain of the N-channel type MOS transistor 19 constituting the second current mirror circuit. The power supply voltage VDD is applied to a source of the second bypass transistor 54.

The output of the operational amplifier 32 in the gain control voltage/current conversion circuit 3 is applied to gates of the pair of second bypass transistors 53 and 54, which are connected with each other.

An N-channel type MOS transistor 55 is connected in series with the first mirror transistor 37. A gate and a drain of the N channel type MOS transistor 55 are connected with each other and its source is grounded. The gate of the N-channel type MOS transistor 55 is connected to gates of the pair of first bypass transistors 51 and 52, which are connected with each other. The N-channel type MOS transistor 55 and the first bypass transistor 51 form a current mirror circuit, while the N-channel type MOS transistor 55 and the other first bypass transistor 52 form another current mirror circuit.

As a result, the gain control current IC1 from the gain control voltage/current conversion circuit 3 flows through each of the pair of first bypass transistors 51 and 52 and each of the pair of second bypass transistors 53 and 54.

While the drain current Id1 that is a half of the drain current 2×Id1 of the constant current source transistor 13 flows through the first differential input transistor 11 if the first bypass transistors 51 does not exist, providing the first bypass transistor 51 forms a bypass route through which the gain control current IC1 flows to the ground bypassing the first differential input transistor 11. Thus, a resulting drain current Id1' flowing through the first differential input transistor 11 becomes a current equal to the original drain current Id1 minus the gain control current IC1, and is represented by Equation 19:

$$Id1' = Id1 - IC1 = \frac{\Delta VC}{RC2} + Id1 - 0.5Id1 = \frac{\Delta VC}{RC2} + 0.5Id1 \quad \text{[Equation 19]}$$

The other first bypass transistor 52 also performs the same function with respect to the second differential input transistor 12. The second bypass transistor 53 merges the gain control current IC1, which is the same amount of current as the current bypassed by the first bypass transistor 51, into the drain current of the N-channel type MOS transistor 17 connected to the drain of the first differential input transistor 11. As a result, a constant drain current Id1 flows through the N-channel type MOS transistor 17. The other second bypass transistor 54 performs the same function.

The total gain G is derived from Equation 9, and is represented by Equation 20:

$$G = 4\beta1 \cdot RO^2 \cdot Id1' = 4\beta1 \cdot RO^2 \cdot \left(\frac{\Delta VC}{RC2} + 0.5Id1\right) = \\ \frac{4\beta1 \cdot RO^2 \cdot \Delta VC}{RC2} + 2\beta1 \cdot RO^2 \cdot Id1 \quad \text{[Equation 20]}$$

Partial differentiation of G with respect to ΔVC leads to Equation 21:

$$\frac{\partial G}{\partial \Delta VC} = \frac{4\beta1 \cdot RO^2}{RC2} \quad \text{[Equation 21]}$$

Thus, it is understood that the total gain G of the voltage controlled variable gain amplifier 100 varies linearly against the difference ΔVC of the gain control voltage VC from the reference voltage VREF. That is, the gain G increases linearly as ΔVC increases. Since ΔVC=VC−VREF, the gain G varies linearly against the gain control voltage VC as a matter of course. Although the gain control voltage/current conversion circuit 3 includes the gain voltage control circuit 31 in the embodiment, the gain voltage control circuit 31 may be omitted because it only inverts the polarity of the gain control voltage VC with respect to the reference voltage VREF and has nothing to do with the linearity of the gain G. In that case, the gain G decreases linearly as ΔVC increases.

It is desirable that the gain G of the voltage controlled variable gain amplifier circuit 100 does not have power supply voltage dependence. The power supply voltage dependence of the gain G can be improved by composing the reference current generation circuit 4 using a circuit that does not have power supply voltage dependence (for example, a constant gm type reference current generation circuit that is to be described).

However, the gain control voltage/current conversion circuit 3 described above has the power supply voltage dependence. Usually the reference voltage VREF and the minimum reference voltage VREF_MIN are generated using the power supply voltage VDD (for example, VREF=0.5VDD, VREF_MIN=0.4VDD). When a case in which central setting is VC=VC2=VREF is considered, IC1=(VREF−VREF_MIN)/RC2=0.1VDD/RC2 is derived from Equation 15, indicating that the gain control current IC1 has the power supply voltage dependence. Accordingly, the gain G that is controlled by the gain control current IC1 also has the power supply voltage dependence.

Figure 7:
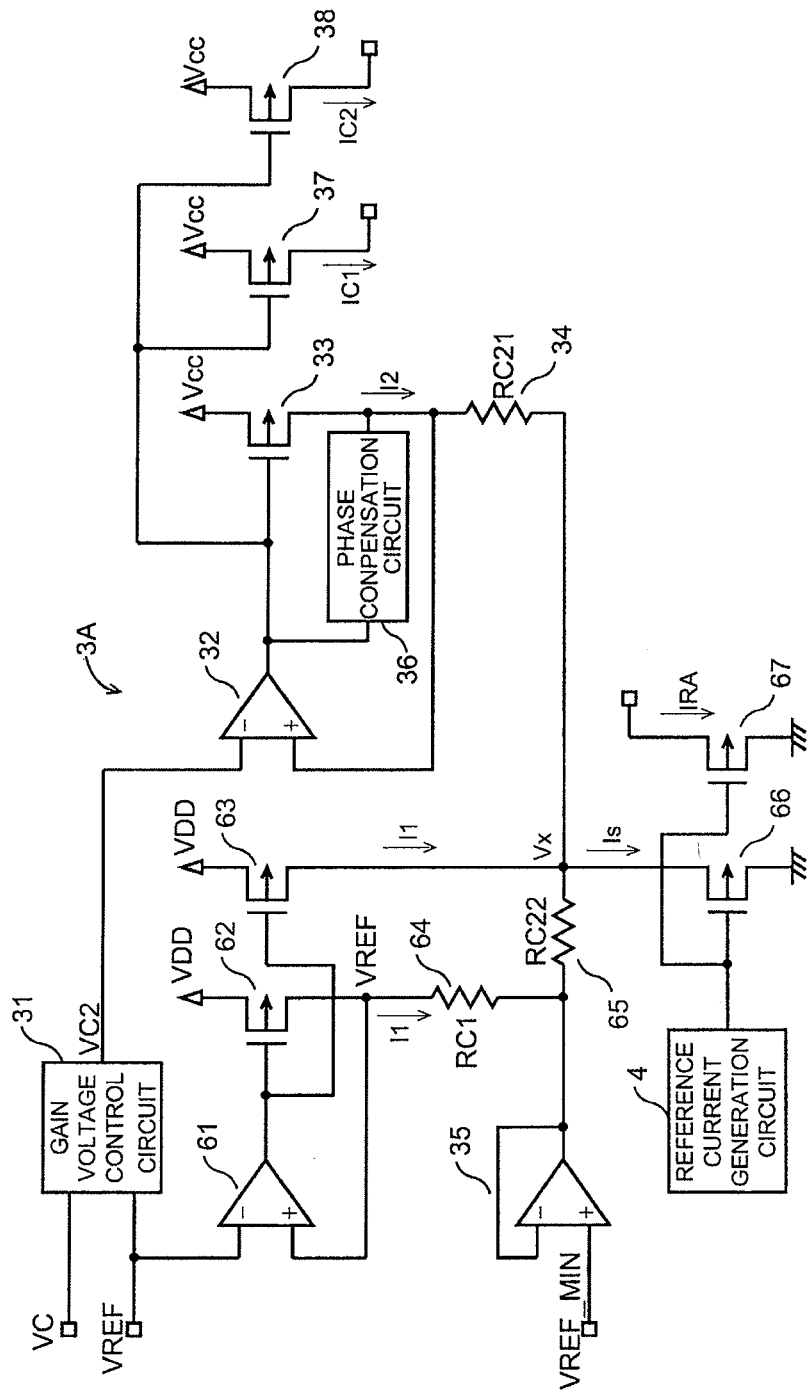
FIG. 7 is a circuit diagram showing a second example circuit of the gain control voltage/current conversion circuit constituting the voltage controlled variable gain amplifier circuit according to the embodiment of this invention.

Therefore, composing the gain control voltage/current conversion circuit 3 using a circuit that does not have power supply voltage dependence is necessary to suppress the power supply voltage dependence of the gain G. FIG. 7 is a circuit diagram showing such a gain control voltage/current conversion circuit 3A.

The gain control voltage/current conversion circuit 3A is formed by providing the gain control voltage/current conversion circuit 3 shown in FIG. 3A with a control circuit to suppress the power supply voltage dependence of the gain control current IC1. The control circuit includes a resistor 65 (second resistor), a first current generation circuit and a second current generation circuit. The resistor 65 has a resistance RC22 and is connected in series with a resistor 34 (first resistor). The resistor 65 is connected between a buffer amplifier 35 and the resistor 34. A resistance of the resistor 34 is denoted as RC21. A current flowing through the resistor 34 through a control transistor 33 is denoted as 12.

The first current generation circuit includes an N-channel type MOS transistor 66 connected between a connecting node between the resistors 34 and 65 and the ground and a reference current generation circuit 4 that controls the N-channel type MOS transistor 66 so that a current Is not having the power supply voltage dependence flows through the N-channel type MOS transistor 66. The reference current generation circuit 4 can be formed of the constant gm type reference current generation circuit that is to be described.

The reference current generation circuit 4 also controls an N-channel type MOS transistor 67 so that a current IRA not having the power supply voltage dependence flows through the N-channel type MOS transistor 67. The current IRA provides the constant current source transistor 13 in each of the first and second differential amplifiers 1 and 2 with the constant drain current 2×Id1 as the reference current through a current mirror circuit (not shown).

The second current generation circuit includes an operational amplifier 61, control transistors 62 and 63 made of P-channel type MOS transistors and a resistor 64 having a resistance RC1. The control transistor 62 and the resistor 64 are connected in series between the power supply voltage VDD and an output terminal of the buffer amplifier 35. The control transistor 63 is connected between the power supply voltage VDD and the connecting node between the resistors 34 and 65. An output of the operational amplifier 61 is applied to gates of the control transistors 62 and 63.

The reference voltage VREF is applied to an inverting input terminal (−), and a voltage at a connecting node between the control transistor 62 and the resistor 64 is applied to a non-inverting input terminal (+) of the operational amplifier 61. Since the voltage at the connecting node between the control transistor 62 and the resistor 64 becomes the reference voltage VREF, a current I1 flowing through the resistor 64 is represented by Equation 22:

$$I1 = \frac{VREF - VREF\_MIN}{RC1} \quad \text{[Equation 22]}$$

When the control transistor 63 has the same size as the control transistor 62, an amount of current that flows through the control transistor 63 is also I1. The current I1 from the control transistor 63 flows into the connecting node between the resistors 34 and 65. A voltage at the connecting node between the resistors 34 and 65 is denoted as Vx.

When the power supply voltage VDD varies, the control circuit suppresses the power supply voltage dependence of the current I2 flowing through the resistor 34, because the voltage Vx is varied by that a variation ΔI1 in the current I1 due to the variation in the power supply voltage VDD flows through the resistor 65. For example, when the power supply voltage VDD rises, the voltage Vx rises accordingly. The current I2 can be set equal to each of IC1 and IC2 flowing through each of the first and second mirror transistors 37 and 38, as described above.

Operations of the gain control voltage/current conversion circuit 3A are hereafter explained using equations. In this case, it is assumed that VREF=0.5VDD and VREF_MIN=0.4VDD. Also assumed is VC=VC2=VREF.

Then, based on Equation 22, the current I1 is represented by Equation 23:

$$I1 = \frac{VREF - REF\_MIN}{RC1} = \frac{0.1VDD}{RC1} \quad \text{[Equation 23]}$$

Equation 24 holds based on conservation law of current:

$$I1 + I2 = Is + \frac{Vx - VREF\_MIN}{RC22} \quad \text{[Equation 24]}$$

On the other hand, I2 is represented by Equation 25:

$$I2 = \frac{VREF - Vx}{RC21} \quad \text{[Equation 25]}$$

From Equation 25, Vx is determined as represented by Equation 26:

$$Vx = VREF - RC21 \cdot I2 \quad \text{[Equation 26]}$$

Equation 27 is obtained by substituting Equation 26 into Equation 24:

$$I1 + I2 = Is + \frac{VREF - RC12 \cdot I2 - VREF\_MIN}{RC22} \quad \text{[Equation 27]}$$

Equation 28 is obtained by substituting Equation 23, VREF=0.5VDD and VREF_MIN=0.4VDD into Equation 27 and solving Equation 27 for I2.

$$I2 = \frac{RC22}{RC21 + RC22} \cdot \left[\left(\frac{1}{RC22} - \frac{1}{RC1}\right) \times 0.1VDD + Is\right] \quad \text{[Equation 28]}$$

According to Equation 28, it is understood that the dependence of the current I2 on the power supply voltage VDD is suppressed. Furthermore, by setting RC1=RC22, the current I2 becomes not dependent on the power supply voltage VDD because (1/RC22−1/RC1)=0. As described above, it is possible to set so that /C1=IC2=I2.

Figure 8:
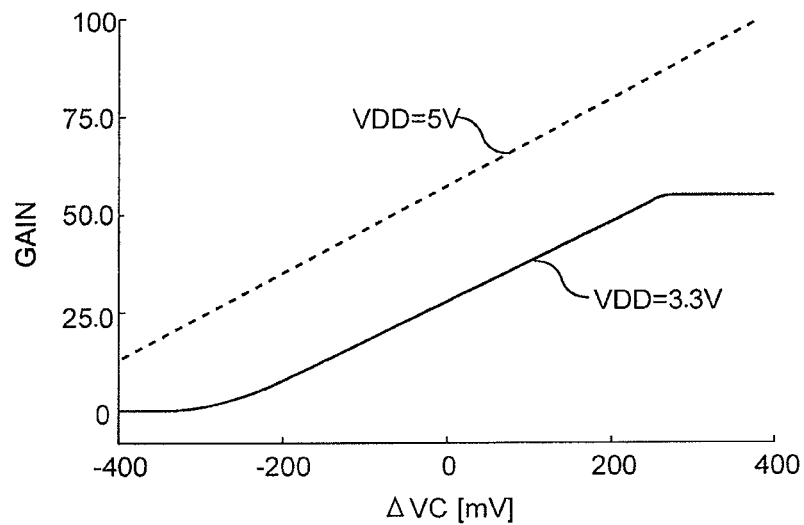
FIG. 8 shows power supply voltage dependence of the gain in the case of the first example circuit of the gain control voltage/current conversion circuit.
Figure 9:
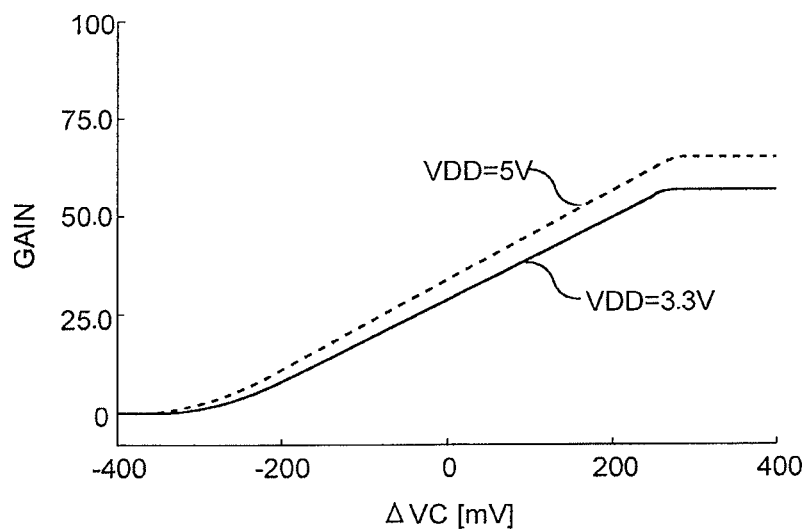
FIG. 9 shows power supply voltage dependence of the gain in the case of the second example circuit of the gain control voltage/current conversion circuit.

FIG. 8 shows characteristics of the gain G when the power supply voltage VDD is 3.3V and 5V in the case where the gain control voltage/current conversion circuit 3 before the improvement is used. FIG. 9 shows characteristics of the gain G when the power supply voltage VDD is 3.3V and 5V in the case where the improved gain control voltage/current conversion circuit 3A is used. It is understood that the characteristics of the gain G are significantly improved in the case where the improved gain control voltage/current conversion circuit 3A is used.

A structure of the constant gm type reference current generation circuit 4 is explained hereafter. The reference current generation circuit 4 provides the constant current source transistor 13 in each of the first and second differential amplifiers 1 and 2 with the drain current 2×Id1 as the reference current, which does not depend on the power supply voltage VDD, as described above. Also, it is used to suppress the power supply voltage dependence of the gain control voltage/current conversion circuit 3A.

In addition, the constant gm type reference current generation circuit 4 is used to suppress the variations due to the semiconductor manufacturing processes and the temperature dependence of the gain G of the voltage controlled variable gain amplifier circuit 100.

Figure 10:
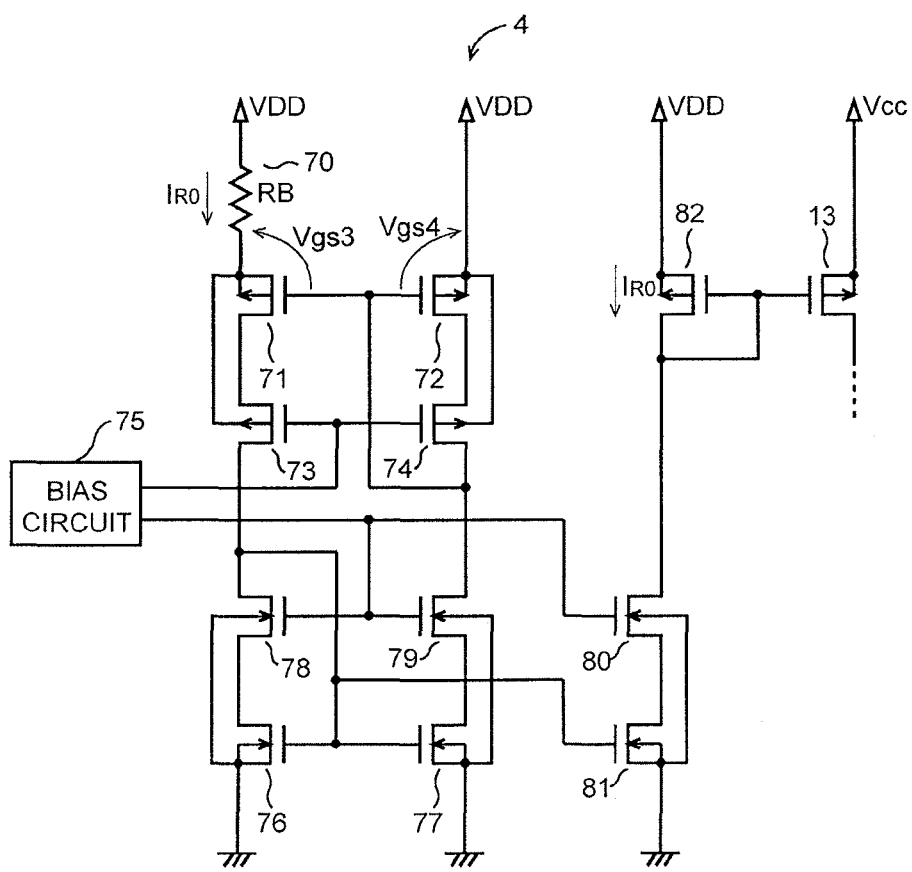
FIG. 10 is a circuit diagram showing a first example circuit (in which cascode connection is used) of a reference current generation circuit constituting the voltage controlled variable gain amplifier circuit according to the embodiment of this invention.

FIG. 10 is a circuit diagram of the constant gm type reference current generation circuit 4. The constant gm type reference voltage generation circuit 4 includes a resistor 70 having a resistance RB, P-channel type MOS transistors 71, 72, 73 and 74, a bias circuit 75 and N-channel type MOS transistors 76, 77, 78 and 79.

The P-channel type MOS transistors 71 and 72 are mirror transistors forming a first current mirror circuit. The resistor 70 is connected between a source of the P-channel type MOS transistor 71 and the power supply voltage. The power supply voltage VDD is applied to a source of the P channel type transistor 72.

Figure 11:
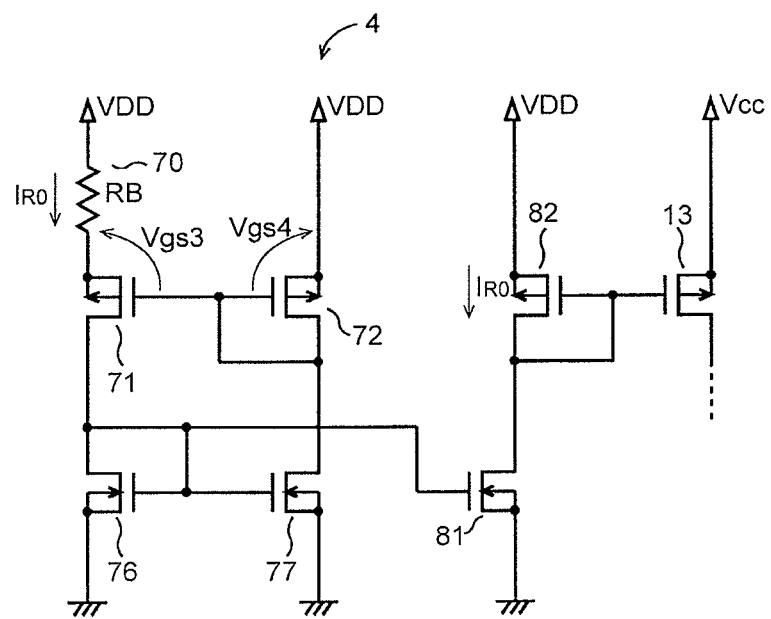
FIG. 11 is a circuit diagram showing a second example circuit (in which the cascode connection is not used) of the reference current generation circuit constituting the voltage controlled variable gain amplifier circuit according to the embodiment of this invention.

The N-channel type MOS transistors 76 and 77 are mirror transistors forming a second current mirror circuit. Sources of the N-channel type MOS transistors 76 and 77 are grounded. The second current mirror circuit is connected with the first current mirror circuit in series. Each of the P-channel type MOS transistors 73 and 74 is cascode-connected to each of the P-channel type MOS transistors 71 and 72, respectively. Each of the N-channel type MOS transistors 78 and 79 is cascode-connected to each of the N-channel type MOS transistors 76 and 77, respectively. When the cascode-connection is not adopted, the P-channel type MOS transistors 73 and 74 and the N-channel type MOS transistors 78 and 79 are omitted as shown in FIG. 11.

Cascode-connected N-channel type MOS transistors 80 and 81 make output transistors of the reference current generation circuit 4. The bias circuit 75 applies a first bias voltage to gates of the P-channel type MOS transistors 73 and 74. The bias circuit 75 also applies a second bias voltage to gates of the N-channel type MOS transistors 78, 79 and 80.

The N-channel type MOS transistors 76 and 81 form a third current mirror circuit. When the cascode-connection is not adopted, the N-channel type MOS transistor 80 is omitted as shown in FIG. 11.

A P-channel type MOS transistor 82 and the N-channel type MOS transistors 80 and 81 are connected in series between the power supply voltage VDD and the ground. The constant current source transistor 13 in each of the first and second differential amplifiers 1 and 2 and the P-channel type MOS transistor 82 form a fourth current mirror circuit.

A voltage between a gate and the source of the P-channel type MOS transistor 71 is denoted as Vgs3, a voltage between a gate and the source of the P-channel type MOS transistor 72 is denoted as Vgs4, and a current flowing through the resistor 70 and the P-channel type MOS transistor 71 is denoted as $I_{RO}$ (reference current). Then, Equation 29 holds:

$$Vgs4 = Vgs3 + I_{RO} \cdot RB \quad \text{[Equation 29]}$$

Equation 30 is derived from the drain current equation in the saturation region (Equation 6):

$$\sqrt{\frac{2I_{RO}}{\mu p \cdot Cox \cdot S4}} + Vt4 = \sqrt{\frac{2I_{RO}}{\mu p \cdot Cox \cdot K \cdot S4}} + Vt3 + I_{RO} \cdot RB \quad \text{[Equation 30]}$$

where a correlation between a gate size ratio S3 of the P-channel type MOS transistor 71 and a gate size ratio S4 of the P-channel type MOS transistor 72 is represented by an equation S3=K×S4, μp denotes mobility, Cox denotes a gate capacitance per unit area of each of the P-channel type MOS transistors 71 and 72, and Vt3 and Vt4 denote threshold voltages of the P-channel MOS transistors 71 and 72, respectively. When a substrate bias effect is neglected and Vt3=Vt4, Equation 30 can be modified to Equation 31:

$$\sqrt{\frac{2I_{RO}}{\mu p \cdot Cox \cdot S4}} \cdot \left(1 - \frac{1}{\sqrt{K}}\right) = I_{RO} \cdot RB \quad \text{[Equation 31]}$$

Derived from Equation 31, the current $I_{RO}$ is represented by Equation 32:

$$I_{RO} \cdot \frac{2}{\mu p \cdot Cox \cdot S4} \cdot \frac{1}{RB^2} \cdot \left(1 - \frac{1}{\sqrt{K}}\right)^2 \quad \text{[Equation 32]}$$

That is, the reference current $I_{RO}$ is inversely proportional to a square of the resistance RB. Although $I_{RO}$ is not affected by the power supply voltage VDD, it is affected by the characteristics (μp, Cox) of the P-channel type MOS transistor 71. It is also affected by temperature dependence of the resistance RB.

The reference current $I_{RO}$ also flows through the P-channel type MOS transistor 82 due to the fourth current mirror circuit (when a mirror ratio α is 1). As a result, the current $I_{RO}$ (=2×Id1) flows through the constant current source transistor 13 in each of the first and second differential amplifier 1 and 2 (when the mirror ratio is 1). Equating the current $I_{RO}$ to 2×Id1 results in that Id1 (=1/2·$I_{RO}$) flows through each of the differential input transistors 11 and 12 shown in FIG. 2.

Next, the gain G1 of the first differential amplifier 1 is determined based on the reference current $I_{RO}$ obtained by the constant gm type reference current generation circuit 4. The gain G1 represented by Equation 8 is modified using the equation Id1=1/2·$I_{RO}$. Then, the gain G1 is represented by Equation 33:

$$G1 = \sqrt{\mu p \cdot Cox \cdot S1 \cdot I_{RO}} \cdot RO \quad \text{[Equation 33]}$$

Equation 34 is obtained by substituting $I_{RO}$ represented by Equations 32 into Equation 33:

$$G1 = \sqrt{\frac{2S1}{S4}} \cdot \left(1 - \frac{1}{\sqrt{K}}\right) \cdot \frac{RO}{RB} \quad \text{[Equation 34]}$$

The total gain G of the voltage controlled variable gain amplifier circuit 100 is derived from Equation 9 and represented by Equation 35:

$$G = G1 \times G2 = \frac{2S1}{S4} \cdot \left(1 - \frac{1}{\sqrt{K}}\right)^2 \cdot \left(\frac{RO}{RB}\right)^2 = \gamma \cdot \left(\frac{RO}{RB}\right)^2 \quad \text{[Equation 35]}$$

γ in Equation 35 is represented by Equation 36:

$$\gamma = \frac{2S1}{S4} \cdot \left(1 - \frac{1}{\sqrt{K}}\right)^2 \quad \text{[Equation 36]}$$

Here, γ is determined by the gate size ratios of the first differential input transistor, 11 and the P-channel type MOS transistor 72, while (RO/RB)² is determined by a ratio of the resistances. Therefore, the power supply voltage dependence, the variations due to the semiconductor manufacturing processes and the temperature dependence of the total gain G of the voltage controlled variable gain amplifier circuit 100 can be suppressed by adopting the constant gm type reference current generation circuit 4.

Figure 12:
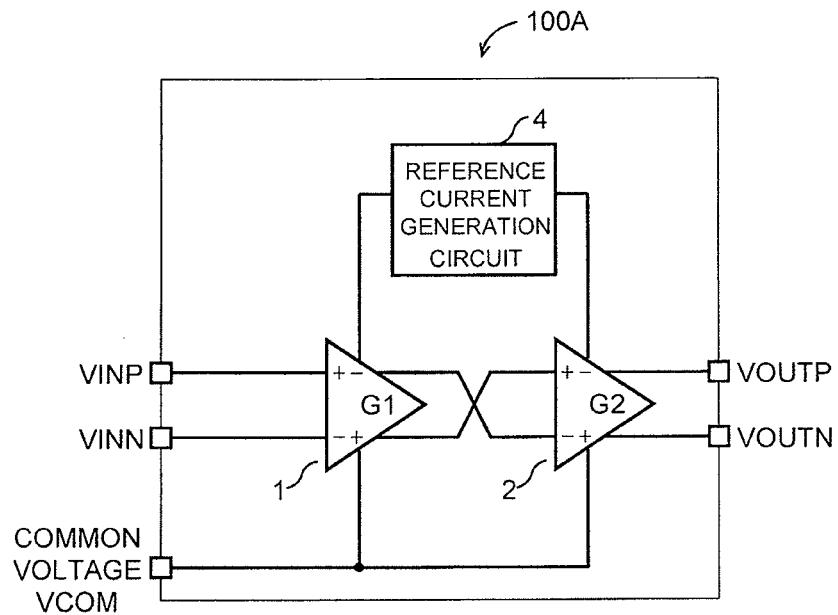
FIG. 12 is a block diagram of a two-stage amplifier circuit using the reference current generation circuit shown in FIG. 10 or FIG. 11.
Figure 13:
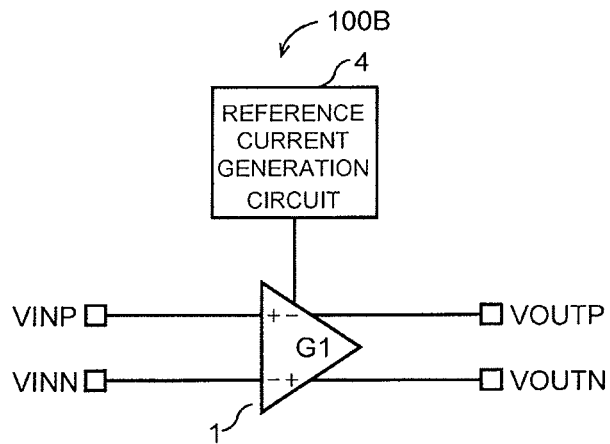
FIG. 13 is a block diagram of a single-stage amplifier circuit using the reference current generation circuit shown in FIG. 10 or FIG. 11.

The constant gm type reference current generation circuit 4 is suitable for using in the voltage controlled variable gain amplifier circuit 100 as described above, and may be used in a two-stage amplifier circuit 100A as shown in FIG. 12 and in a single-stage amplifier circuit 100B as shown in FIG. 13 as well. That is, as understood from Equation 34, the variations due to the semiconductor manufacturing processes and the temperature dependence of the gain G1 of the first differential amplifier 1 can be suppressed as well.

The voltage controlled variable gain amplifier circuit varies its gain linearly and continuously against the gain control voltage, as described above. In addition, the power supply voltage dependence of the voltage controlled variable gain amplifier circuit is suppressed. Furthermore, the variations due to semiconductor manufacturing processes and temperature dependence of the gain of the voltage controlled variable gain amplifier circuit can be also suppressed.

What is claimed is:

1. A voltage controlled variable gain amplifier circuit comprising:
    a first differential amplifier and a second differential amplifier, each comprising a constant current source generating a reference current, a pair of differential input transistors to which the reference current from the constant current source is supplied, a pair of output terminals outputting a pair of differential output voltages, and first and second output resistors connected in series between the pair of output terminals, the second differential amplifier receiving the pair of differential output voltages of the first differential amplifier;
    a gain control voltage/current conversion circuit converting a gain control voltage into a gain control current varying linearly against the gain control voltage; and
    a current bypass circuit forming bypass routes through each of which a portion of the reference current corresponding to the gain control current bypasses a corresponding differential input transistor.

2. The voltage controlled variable gain amplifier circuit of claim 1, wherein the current bypass circuit comprises a first bypass transistor, a drain of the first bypass transistor being connected to a source of the differential input transistor, a source of the first bypass transistor being connected to a ground, and the gain control current flowing into the ground bypassing the differential input transistor.

3. The voltage controlled variable gain amplifier circuit of claim 2, wherein the current bypass circuit further comprises a second bypass transistor merging the same amount of current as the current bypassed by the first bypass transistor into a drain current route of the differential input transistor.

4. The voltage controlled variable gain amplifier circuit of claim 1, wherein the gain control voltage/current conversion circuit comprises a resistor to which a voltage corresponding to the gain control voltage is applied, and the gain control current is obtained from the resistor.

5. The voltage controlled variable gain amplifier circuit of claim 1, wherein the gain control voltage/current conversion circuit comprises a resistor having a first terminal and a second terminal; a first control transistor connected to the first terminal of the resistor; a gain voltage control circuit generating a second gain control voltage by inverting the gain control voltage with respect to a first reference voltage; an operational amplifier having an inverting input terminal and a non-inverting input terminal and outputting an output voltage, the second gain control voltage being applied to the inverting input terminal, a voltage at the first terminal of the resistor being applied to the non-inverting input terminal, the output voltage being applied to a gate of the first control transistor; a reference voltage source applying a second reference voltage to the second terminal of the resistor; and a second control transistor forming a current mirror circuit in combination with the first control transistor, wherein the gain control current is obtained from the second control transistor.

6. The voltage controlled variable gain amplifier circuit of claim 1, wherein the gain control voltage/current conversion circuit comprises a first resistor having a first terminal and a second terminal; a first control transistor connected to the first terminal of the resistor; a gain voltage control circuit generating a second gain control voltage by inverting the gain control voltage with respect to a first reference voltage; an operational amplifier having an inverting input terminal and a non-inverting input terminal and outputting an output voltage, the second gain control voltage being applied to the inverting input terminal, a voltage at the first terminal of the resistor being applied to the non-inverting input terminal, the output voltage being applied to a gate of the first control transistor; a control circuit suppressing power supply voltage dependence of a current flowing through the first resistor by varying a voltage at the second terminal of the first resistor; and a second control transistor forming a current mirror circuit in combination with the first control transistor, wherein the gain control current is obtained from the second control transistor.

7. The voltage controlled variable gain amplifier circuit of claim 6, wherein the control circuit comprises a second resistor having a third terminal and a fourth terminal, the third terminal being connected with the second terminal of the first resistor; a reference voltage source applying a second reference voltage to the fourth terminal of the second resistor; a first current generation circuit connected between the third terminal of the second resistor and a ground and providing a current having no power supply voltage dependence; and a second current generation circuit providing the third terminal of the second resistor with a current corresponding to a difference between the first reference voltage and the second reference voltage and having power supply voltage dependence.

8. The voltage controlled variable gain amplifier circuit of claim 7, wherein the second current generation circuit comprises a third resistor having a fifth terminal and a sixth terminal, the first reference voltage being applied to the fifth terminal and the second reference voltage being applied to the sixth terminal.

9. The voltage controlled variable gain amplifier circuit of claim 8, wherein a resistance of the second resistor is equal to a resistance of the third resistor.

10. The voltage controlled variable gain amplifier circuit of claim 1, further comprising a reference current generation circuit providing the constant current source with the reference current, the reference current generation circuit comprising first and second mirror transistors foaming a current mirror circuit and a reference resistor connected with a source of the first mirror transistor, wherein the reference current is obtained from the second mirror transistor.

11. A voltage controlled variable gain amplifier circuit comprising:
 a current source for generating a substantially constant reference current;
 a differential input stage for selectively diverting the reference current along first and second current paths in response to a difference in voltage between first and second input signals;
 an output stage for forming first and second voltages of a differential output voltage in response to currents conducted along the first and second current paths; and
 a current bypass circuit for providing an additional current to each of the first and second current paths in response to a gain control voltage, wherein the additional current varies linearly with variations in the gain control voltage.

12. The voltage controlled variable gain amplifier circuit of claim 11 wherein the current source comprises:
 a transistor having a first current electrode coupled to a power supply voltage terminal, a control electrode, and a second current electrode coupled to each of the first and second current paths; and
 a reference current generation circuit coupled to the control electrode of the transistor for mirroring the reference current through the transistor.

13. The voltage controlled variable gain amplifier circuit of claim 11 wherein the current bypass circuit comprises:
 a first transistor having a first current electrode coupled to a first power supply voltage terminal, a control electrode for receiving a first control voltage, and a second current electrode coupled to the first current path;
 a second transistor having a first current electrode coupled to the first power supply voltage terminal, a control electrode for receiving the first control voltage, and a second current electrode coupled to the second current path; and
 a third transistor having a first current electrode coupled to the current source, a control electrode for receiving a second control voltage, and a second current electrode coupled to a second power supply voltage terminal.

14. The voltage controlled variable gain amplifier circuit of claim 13 wherein the current bypass circuit further comprises:
 a fourth transistor having a first current electrode coupled to the current source, a control electrode for receiving the second control voltage, and a second current electrode coupled to the second power supply voltage terminal, wherein each of the first, second, third, and fourth transistors conduct a first current.

15. The voltage controlled variable gain amplifier circuit of claim 11 wherein the output stage comprises:
 a first current mirror having an input coupled to the first current path, and an output for forming the first voltage; and
 a second current mirror having an input coupled to the second current path, and an output for forming the second voltage.

16. The voltage controlled variable gain amplifier circuit of claim 15 wherein the output stage further comprises:
 a second current source coupled between a first power supply voltage terminal and the output of the first current mirror; and
 a third current source coupled between the first power supply voltage terminal and the output of the second current mirror.

17. The voltage controlled variable gain amplifier circuit of claim 15 wherein the output stage further comprises:
 a first resistor having a first terminal coupled to the output of the first current mirror, and a second terminal;
 a second resistor having a first terminal coupled to the output of the second current mirror, and a second terminal coupled to the second terminal of the first resistor;
 a first capacitor having a first terminal coupled to the output of the first current mirror, and a second terminal; and
 a second capacitor having a first terminal coupled to the output of the second current mirror, and a second terminal coupled to the second terminal of the first capacitor.

18. A method for amplifying a differential input voltage comprising:
 conducting a first current that is substantially constant;
 diverting the first current along first and second current paths based on a difference between first and second input voltages, respectively, according to a gain;
 forming first and second output voltages of a differential output voltage in response to currents conducted along the first and second current paths;
 providing an additional current to each of the first and second current paths; and
 varying the additional current linearly in response to a gain control voltage.

19. The method of claim 18 wherein the diverting comprises:
 diverting the first current along the first and second current paths using first and second MOS transistors, respectively.

20. The method of claim 18 wherein the forming comprises:
 mirroring currents conducted in the first and second current paths to third and fourth current paths, respectively; and
 providing the first and second output voltages in response to currents conducted in the third and fourth current paths, respectively.

* * * * *